(12) United States Patent
Sasabe

(10) Patent No.: US 11,747,845 B2
(45) Date of Patent: Sep. 5, 2023

(54) MIRROR CLAMP CIRCUIT

(71) Applicant: ROHM CO., LTD., Kyoto (JP)

(72) Inventor: Akio Sasabe, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 17/913,632

(22) PCT Filed: Feb. 8, 2021

(86) PCT No.: PCT/JP2021/004537
§ 371 (c)(1),
(2) Date: Sep. 22, 2022

(87) PCT Pub. No.: WO2021/199682
PCT Pub. Date: Oct. 7, 2021

(65) Prior Publication Data
US 2023/0152827 A1 May 18, 2023

(30) Foreign Application Priority Data
Mar. 30, 2020 (JP) .................................. 2020-060595

(51) Int. Cl.
*H03K 17/08* (2006.01)
*G05F 1/56* (2006.01)

(52) U.S. Cl.
CPC ............... *G05F 1/56* (2013.01); *H03K 17/08* (2013.01)

(58) Field of Classification Search
None
See application file for complete search history.

(56) References Cited

U.S. PATENT DOCUMENTS

| 6,717,785 B2* | 4/2004 | Fukuda | H03K 17/0828 |
| | | | 361/86 |
| 6,720,819 B1* | 4/2004 | Yamamoto | H03K 17/04123 |
| | | | 327/434 |
| 7,068,082 B2* | 6/2006 | Kojima | H03K 17/0406 |
| | | | 327/108 |

(Continued)

FOREIGN PATENT DOCUMENTS

JP 2016171720 9/2016

OTHER PUBLICATIONS

International Search Report in International Appln. No. PCT/JP2021/004537, dated Mar. 23, 2021, 6 pages (with English Translation).

*Primary Examiner* — Thomas J. Hiltunen
(74) *Attorney, Agent, or Firm* — Fish & Richardson P.C.

(57) ABSTRACT

A mirror clamp circuit includes a comparator having a first input terminal connectable to a first control terminal of a transistor having the first control terminal connected to the other terminal of a resistor of which one terminal is fed with an output voltage and a first terminal fed with a reference potential and a second input terminal fed with a reference voltage, a transistor switch having a second control terminal fed with a control terminal voltage based on a comparison signal output from the comparator and inserted between the first control terminal and the reference potential, an OR circuit fed with a signal based on the control terminal voltage and the output voltage, and a current feeder configured to change the amount of current fed to the comparator based on the output of the OR circuit.

8 Claims, 5 Drawing Sheets

(56) References Cited

U.S. PATENT DOCUMENTS

| | | | | |
|---|---|---|---|---|
| 7,126,802 B2* | 10/2006 | Ishikawa | ............ | H03K 17/0828 |
| | | | | 361/94 |
| 7,483,250 B2* | 1/2009 | Ishikawa | ............ | H03K 17/0828 |
| | | | | 361/87 |
| 7,504,849 B2* | 3/2009 | Ohshima | ................ | H03K 17/18 |
| | | | | 324/764.01 |
| 7,679,406 B2* | 3/2010 | Yagi | .................... | H03F 3/45192 |
| | | | | 327/55 |
| 9,172,367 B2* | 10/2015 | Fukuta | .................... | H03K 17/30 |
| 11,217,989 B2* | 1/2022 | Kaeriyama | ........... | H02H 1/0007 |
| 11,531,054 B2* | 12/2022 | Kwon | ................... | H02H 1/0007 |
| 2008/0212247 A1* | 9/2008 | Lee | .................. | H03K 17/08128 |
| | | | | 361/88 |
| 2012/0126859 A1* | 5/2012 | Kawamoto | ............ | H03K 3/012 |
| | | | | 327/108 |

* cited by examiner

MIRROR CLAMP CIRCUIT

TECHNICAL FIELD

The present invention relates to a mirror clamp circuit which prevents erroneous turning-on of a transistor.

BACKGROUND ART

A method called mirror clamping is known as a method for preventing erroneous turning-on of a transistor such as a MOSFET (metal-oxide-semiconductor field-effect transistor), an IGBT (insulated gate bipolar transistor), or the like. In mirror clamping, if the target transistor is a MOSFET, a switch for mirror clamping is inserted between the gate of the transistor, of which the source is fed with a reference potential, and the reference potential. The switch is configured with, for example, a MOSFET. By keeping the switch on when the transistor is off, the Vgs of the transistor (the voltage between its gate and source) is forcibly kept at approximately 0 V to prevent a rise in the gate voltage of the transistor. If the target transistor is an IGBT, the switch is inserted between the gate of the transistor, of which the emitter is fed with the reference potential, the reference potential.

Moreover, in mirror clamping, the switch is turned on with a comparator that compares the gate voltage of the transistor and a predetermined reference voltage. Such a mirror clamp is disclosed in, for example, Patent Document 1.

CITATION LIST

Patent Literature

Patent Document 1: Japanese Unexamined Patent Application Publication No. 2016-171720 (FIG. 9)

SUMMARY OF INVENTION

Technical Problem

Inconveniently, the known mirror clamp configuration suffers from increased power consumption, because it keeps feeding a relatively large current to the comparator mentioned above to achieve high operation speed.

Against the background discussed above, an object of the present invention is to provide a mirror clamp circuit that permits reduction of power consumption.

Solution to Problem

According to one aspect of the present invention, a mirror clamp circuit includes:
a comparator having:
 a first input terminal connectable to a first control terminal of a transistor having
  the first control terminal connected to the other terminal of a resistor of which one terminal is fed with an output voltage and
  a first terminal fed with a reference potential; and
 a second input terminal fed with a reference voltage;
a transistor switch having a second control terminal fed with a control terminal voltage based on a comparison signal output from the comparator, the transistor switch being inserted between the first control terminal and the reference potential;

an OR circuit fed with a signal based on the control terminal voltage and the output voltage; and
a current feeder configured to change the amount of current fed to the comparator based on the output of the OR circuit (a first configuration).

In first configuration described above, there may be further provided a latch circuit configured to latch the control terminal voltage at low level when the output voltage is at high level (a second configuration).

In first or second configuration described above, there may be further provided a delay circuit configured to delay the control terminal voltage and output, as a result of the delaying, a delayed signal, and the signal based on the control terminal voltage may be the delayed signal (a third configuration).

In any of the first to third configurations described above, the current feeder may include:
 a first constant-current source;
 a first current mirror configured to generate a first output current based on a first input current generated by the first constant-current source;
 a second current mirror configured to generate a second output current based on the first input current;
 a switch disposed in a path across which the second output current flows, the switch being configured to be turned on and off based on the output of the OR circuit.

Here, when the switch is on, a current may be supplied to the comparator based on a current generated by combining the first and second output currents together (a fourth configuration).

In the fourth configuration described above, the first current mirror, the second current mirror, and the switch may be configured with PMOS transistors (a fifth configuration).

In any of the first to fifth configurations described above, the transistor switch may be an NMOS transistor (sixth configuration).

According to another aspect of the present invention, an IC package includes: the mirror clamp circuit according to any of the configurations described above; an output terminal configured to output the output voltage to the outside; a mirror clamp terminal configured to permit the first control terminal to be connected to the outside; and a reference potential terminal configured to permit the reference potential to be applied to it (a seventh configuration).

In the seventh configuration described above, there may be further provided: a pulse generator configured to generate a pulse based on an input signal; a logic circuit; an isolation transformer configured to transmit the pulse to the logic circuit; and a switching arm configured with a switching element connected in series between a supply voltage and the reference potential, the switching arm being configured to generate the output voltage by being driven by the logic circuit (an eighth configuration).

Advantageous Effects of Invention

With a mirror clamp circuit according to the present invention, it is possible to reduce power consumption.

DESCRIPTION OF EMBODIMENTS

Hereinafter, an exemplary embodiment of the present invention will be described with reference to the drawings.

Figure 1:
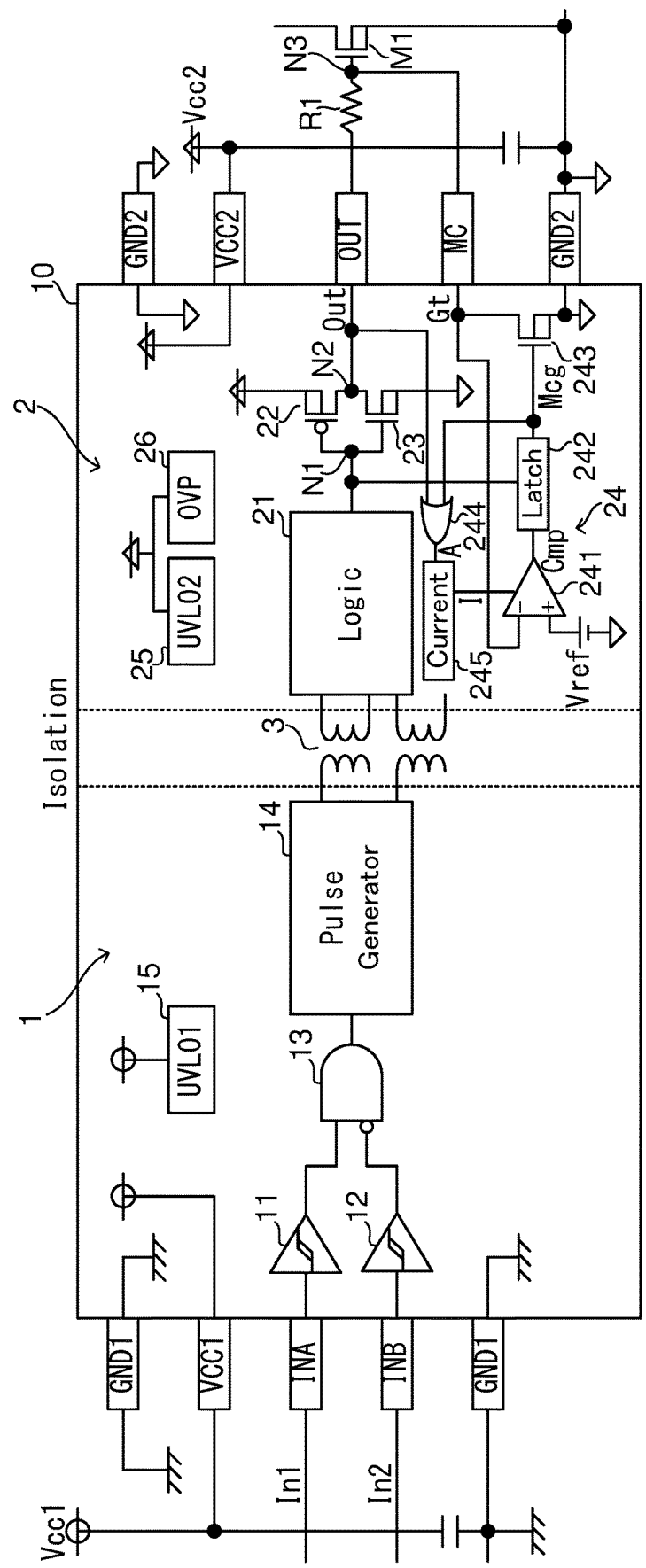
FIG. 1 is a diagram showing a configuration of a gate driver according to an exemplary embodiment of the present invention.

<Configuration of a gate driver> FIG. 1 is a diagram showing the configuration of a gate driver 10 according to the exemplary embodiment of the present invention. As shown in FIG. 1, the gate driver 10 is a device that drives the gate of an NMOS transistor M1.

The gate driver 10 includes a primary circuit 1, a secondary circuit 2, and an isolation transformer 3. The gate driver 10 is an IC package including a GND1 terminal, a VCC1 terminal, an INA terminal, an INB terminal, a GND2 terminal (reference potential terminal), a VCC2 terminal, an OUT terminal (output terminal), and an MC terminal (mirror clamp terminal) which are external terminals (lead terminals) for establishing electrical connection with the outside.

The primary circuit 1 includes a first Schmitt trigger 11, a second Schmitt trigger 12, an AND circuit 13, a pulse generator 14, and a first UVLO (undervoltage lock-out) circuit 15.

The secondary circuit 2 includes a logic circuit 21, a PMOS transistor 22, a NMOS transistor 23, a mirror clamp circuit 24, a second UVLO circuit 25, and an OVP (overvoltage protection) circuit 26.

The isolation transformer 3 is provided to connect together the primary and secondary circuits 1 and 2. The isolation transformer 3 isolates the primary and secondary circuits 1 and 2 from each other while transmitting a signal from the primary circuit 1 to the secondary circuit 2.

The first UVLO circuit 15 monitors a supply voltage Vcc1, which is applied to the VCC1 terminal, and when the supply voltage Vcc1 drops below a specified voltage, the first UVLO circuit 15 shuts down the primary circuit 1.

The first Schmitt trigger 11 transmits a first input signal In1, which is input from the outside to the INA terminal, to a first input terminal of the AND circuit 13. The second Schmitt trigger 12 transmit a second signal In2, which is input from the outside to the INB terminal, to a second input terminal the AND circuit 13.

The AND circuit 13 outputs the AND of the signal level input to its first input terminal and the level resulting from inverting the signal level input its the second input terminal. As a result, the output of the AND circuit 13 is at low level when the first and second input signals In1 and In2 are both at low level, or the first input signal In1 is at low level and the second input signal In2 is at high level, or the first and second input signals In1 and In2 are both at low level, and is at high level when the first input signal In1 is at high level and the second input signal In2 is at low level.

When triggered by a fall of the output of the AND circuit 13 from high level to low level, the pulse generator 14 generates a pulse with a smaller width than the output of the AND circuit 13 and outputs the pulse to the primary side of the isolation transformer 3. A change in current caused by the pulse fed to the primary side of the isolation transformer 3 produces a current in the secondary side of the isolation transformer 3, and this current is fed to the logic circuit 21.

In this state, the logic circuit 21 outputs a high-level signal, which is input to the gate of PMOS transistor 22 and to the gate of NMOS transistor 23.

Here, the PMOS transistor 22 (switching element) and the NMOS transistor 23 (switching element) constitute a switching arm by being connected in series between the supply voltage Vcc2, which is applied to the VCC2 terminal, and the second ground GND2, which is applied to the GND2 terminal. Specifically, the source of the PMOS transistor 22 is connected to an application terminal for the supply voltage Vcc2. The drain of the PMOS transistor 22 is connected to the drain of the NMOS transistor 23 at a node N2. The source of the NMOS transistor 23 is connected to an application terminal for the second ground GND2.

A node N1, at which the gates of the PMOS and NMOS transistors 22 and 23 are connected together, is connected to the output terminal of the logic circuit 21.

The node N2 is connected to the OUT terminal. One terminal of a resistor R1 is externally connected to the OUT terminal. The other terminal of the resistor R1 is connected to the gate of the NMOS transistor M1 (first control terminal). The source of the NMOS transistor M1 (first terminal) is externally connected to the GND2 terminal. The second ground GND2, which serves as the reference potential for in the secondary circuit 2, differs from the first ground GND1, which is applied to the GND1 terminal and which serves as the reference potential for the primary circuit 1.

Here, with the high-level signal from the logic circuit 21 applied to the node N1, the PMOS transistor 22 is off, the NMOS transistor 23 is on, and an output voltage Out, which is the voltage at the OUT terminal, is equal to the second ground GND2 (low level). As a result, the NMOS transistor M1 is off.

By contrast, then triggered by a rise of the output of the AND circuit 13 from low level to high level, the pulse generator 14 generates a pulse with a smaller width than the output of the AND circuit 13 and outputs the pulse to the primary side of the isolation transformer 3. A change in current caused by the pulse fed to the primary side of the isolation transformer 3 produces a current in the secondary side of the isolation transformer 3, and this current is fed to the logic circuit 21. In this state, the logic circuit 21 outputs a low-level signal, which is applied to the node N1.

In this state, the PMOS transistor 22 is on, the NMOS transistor 23 is off, and an output voltage Out is equal to the supply voltage Vcc2 (high level). As a result, the NMOS transistor M1 is on.

The transistor to be driven by the gate driver 10 can be configured with an IGBT instead of the NMOS transistor M1. In that case, the other terminal of the resistor R1 is connected to the gate of the IGBT and the GND2 terminal is connected to the emitter of the IGBT.

The second UVLO circuit 25 monitors the supply voltage Vcc2, which is applied to the VCC2 terminal. When the supply voltage Vcc2 drops below a specified voltage, the second UVLO circuit 25 shuts down the secondary circuit 2. The OVP circuit 26 is a circuit that detects an overvoltage in the supply voltage Vcc2.

<Configuration of the mirror clamp> Next, the configuration of the mirror clamp circuit 24 in the secondary circuit 2 will be described. The mirror clamp circuit 24 is a circuit that prevents erroneous turning-on of the NMOS transistor M1 in the off state.

As shown in FIG. 1, the mirror clamp circuit 24 includes a comparator 241, a latch circuit 242, an NMOS switch 243, an OR circuit 244, and a current feeder 245.

The MC terminal is externally connected to a node N3, to which the other terminal of the resistor R1 and the gate of the NMOS transistor M1 are connected. The inverting input terminal (−) of the comparator 241 is connected to the MC terminal. Thus, the inverting input terminal (−) of the comparator 241 is fed with the voltage at the MC terminal, that is, a first gate voltage Gt for the NMOS transistor M1. A predetermined reference voltage Vref is applied to the non-inverting input terminal (+) of the comparator 241.

The comparator 241 outputs, as the result of comparing the first gate voltage Gt with the reference voltage Vref, a comparison signal Cmp to the latch circuit 242. According to the voltage level at the node N1, that is, the level of the output voltage Out, the latch circuit 242 switches between outputting the comparison signal Cmp as it is with the same level as the second gate voltage Mcg and outputting the second gate voltage Mcg latched at low level regardless of the comparison signal Cmp.

The NMOS switch 243, which is an NMOS transistor, is inserted between the MC terminal and the GND2 terminal. Specifically, the drain of the NMOS switch 243 is connected to the MC terminal. The source of the NMOS switch 243 is connected to the GND2 terminal. That is, the NMOS switch 243 is inserted between the gate of the NMOS transistor M1 and the second ground GND2 (reference potential).

The second gate voltage (control terminal voltage) Mcg is applied to the gate of the NMOS switch 243 (second control terminal). The second gate voltage Mcg is input to the first input terminal of the OR circuit 244 and the output voltage Out is input to the second input terminal of the OR circuit 244. The current feeder 245 switches between feeding a current with a reference amount of current to the comparator 241 and feeding a current with an amount of current increased from the reference amount the comparator 241, depending to the output level of the OR circuit 244.

Figure 2:
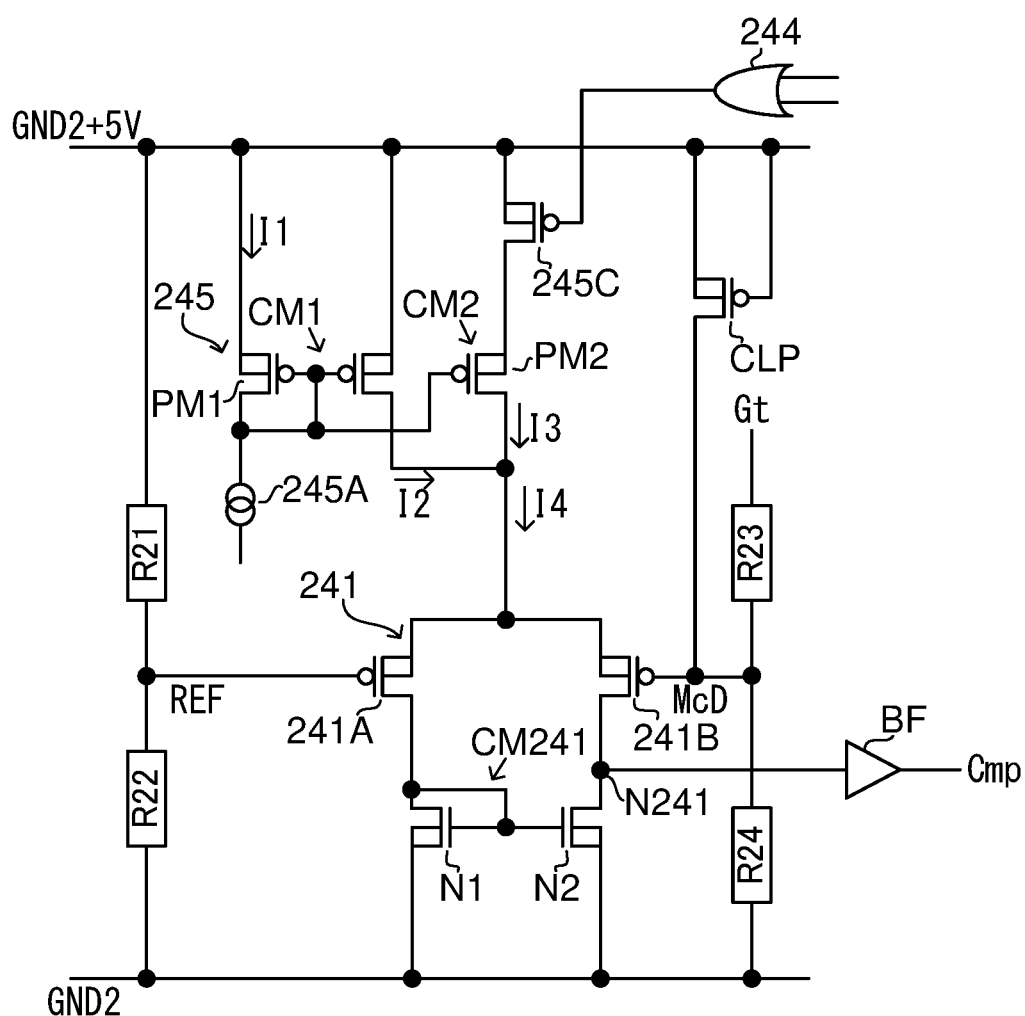
FIG. 2 is a diagram showing an example of a specific circuit configuration of a comparator and a current feeder.

<Configuration of the comparator and the current feeder>
FIG. 2 is a diagram showing an example of a specific circuit configuration of the comparator 241 and the current feeder 245.

The comparator 241 includes PMOS transistors 241A and 241B, a current mirror CM241, a buffer BF, a clamper CLP, and voltage division resistors R21 to R24.

The source of the PMOS transistor 241A is connected to the current feeder 245. The gate of the PMOS transistor 241A is fed with a predetermined reference voltage REF resulting from dividing, with the voltage division resistors R21 and R22, a voltage higher than the second ground GND2 by a reference voltage (as an example, 5V) (hereinafter, the upper voltage).

The source of the PMOS transistor 241B is connected to the current feeder 245. The gate of the PMOS transistor 241B is fed with a division voltage McD resulting from dividing, with the voltage division resistors R23 and R24, the first gate voltage Gt (see FIG. 1).

The source and gate of the clamper CLP, configured with a PMOS transistor is connected to the application terminal for the upper voltage. The drain of the clamper CLP is connected to the gate of the PMOS transistor 241B.

The current mirror CM241 is configured with NMOS transistors N1 and N2. More specifically, the drain and the gate of the NMOS transistor N1 is short-circuited. The gates of the NMOS transistors N1 and N2 are connected together. The sources of the NMOS transistors N1 and N2 are both connected to the application terminal for the second ground GND2.

The drain of the PMOS transistor 241A is connected to the drain of the NMOS transistor N1. The signal appearing at a node N241, at which the drains of the PMOS and NMOS transistors 241B and N2 are connected together, is output as the comparison signal Cmp (see FIG. 1) via the buffer BF.

The current feeder 245 includes a constant-current source 245A, a PMOS transistor (switch) 245C, a current mirror CM1 configured with PMOS transistors, and a current mirror CM2 configured with PMOS transistors.

The current mirror CM1 includes a PMOS transistor PM1 as an input-side transistor, and multiplies by one the input current I1 generated by the constant-current source 245A, to output the result as an output current I2.

The current mirror CM2 includes the PMOS transistor PM1 as an input-side transistor, and multiplies the input current I1 by X (X>1) to output the result as an output current I3. To the source of the output-side PMOS transistor PM2 of the current mirror CM2, the drain of the PMOS transistor 245C is connected, and the source of the PMOS transistor 245C is connected to the application terminal for the upper voltage. The gate of the PMOS transistor 245C is fed with the output signal of the OR circuit 244. Thus, when the output of the OR circuit 244 is at low level and the PMOS transistor 245C is on, the output current I3 is generated. When the output of the OR circuit 244 is at high level and the PMOS transistor 245C is off, the output current I3 is not generated.

The output currents I2 and I3 are combined together to generate a feed current I4. When the output current I3 is not generated, the output current I2 as it is becomes the feed current I4. The feed current I4 is distributed between and supplied to PMOS transistors 241A and 241B.

Here, depending to the reference voltage REF and the division voltage McD, how the feed current I4 is distributed between the currents flowing through the PMOS transistors 241A and 241B of the feed current I4 changes.

When the division voltage McD is lower than the reference voltage REF, the PMOS transistor 241B allows more current than the PMOS transistor 241A, and thus the comparison signal Cmp is at high level.

By contrast, when the division voltage McD is higher than the reference voltage REF, the PMOS transistor 241A allows more current than the PMOS transistor 241B, and thus the comparison signal Cmp is at low level.

Therefore, in the configuration shown in FIG. 1, the reference voltage Vref compared with the first gate voltage Gt by the comparator 241 is defined by the reference voltage REF and the voltage division ratio at which the division voltage McD is generated.

When the PMOS transistor 245C is off according to the output of the OR circuit 244, the output current I3 is not generated, and thus the feed current I4 with the reference amount of current generated based on the output current I2 is distributed between and supplied to the PMOS transistors 241A and 241B.

By contrast, when the PMOS transistor 245C is on according to the output of the OR circuit 244, the output current I3 is generated, and thus the feed current I4 with an amount of current increased from the reference amount, that is, the current generated by combining the output currents I2 and I3 together, is distributed between and supplied to the PMOS transistors 241A and 241B. Thus, the operating speed of the comparator 241 increases.

Figure 3:
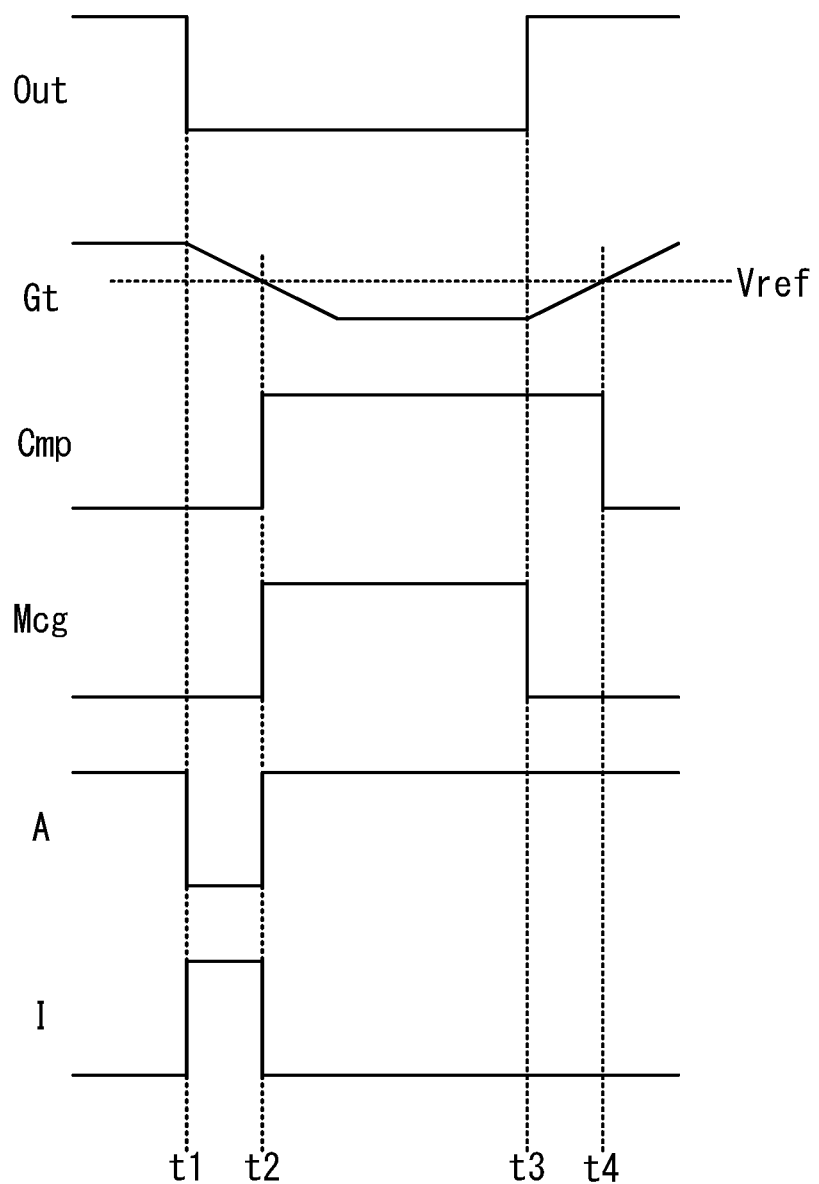
FIG. 3 is a timing chart showing an example of operation of a mirror clamp circuit according to an exemplary embodiment of the present invention.

<Operation of the mirror clamp circuit> Next, the operation of the mirror clamp circuit 24 will be described based on the configuration in FIG. 1 described previously and a timing chart in FIG. 3. FIG. 3 shows, from top down, the output voltage Out, the first gate voltage Gt, the comparison signal Cmp, the second gate voltage Mcg, an OR output A, which is the output of the OR circuit 244, and a feed current I from the current feeder 245. In the configuration in FIG. 2 described previously, the feed current I correspond to the feed current I4.

In FIG. 3, immediately before timing t1, at which the output voltage Out turns from high level to low level, the first gate voltage Gt is at high level and thus the comparison signal Cmp is at low level. When the output voltage Out is at high level, if the NMOS switch 243 is on, an overcurrent flows from the OUT terminal to the NMOS switch 243 via the resistor R1 and the MC terminal, and thus it is preferable that the NMOS switch 243 be kept off. Accordingly, when the output voltage Out is at high level, the latch circuit 242 latches the second gate voltage Mcg at low level. Since the output voltage Out is at high level, the OR output A is at high level. As a result, the PMOS transistor 245C in FIG. 2 is off and the feed current I is at a reference level.

When the output voltage Out turns from high level to low level at timing t1, owing to the resistor R1, the first gate voltage Gt starts to fall slowly from the output voltage Out. When the output voltage Out is at low level, the latch circuit 242 outputs the level of the comparison signal Cmp as it is as the second gate voltage Mcg.

Thus, the output voltage Out and the second gate voltage Mcg are both at low level and hence the OR output A is at low level. Thus, the PMOS transistor 245C in FIG. 2 is turned on and the feed current I now has a level increased from the reference level. In this way, the operation speed of the comparator 241 can be increased in advance in preparation for detection, by the comparator 241, of the first gate voltage Gt having reached the reference voltage Vref as a result of a fall in the first gate voltage Gt.

After that, the first gate voltage Gt falls and reaches the reference voltage Vref at timing t2, when the comparator 241 turns the comparison signal Cmp to high level, and the second gate voltage Mcg is turned to high level. Thus, the NMOS switch 243 is turned on, the Vgs of the NMOS transistor M1 is forced to be at approximately 0 V, and a rise in the gate voltage of the NMOS transistor M1 can be prevented. In this way, erroneous turning-on of the NMOS transistor M1 can be prevented.

Since the second gate voltage Mcg is at high level, the OR output A is at high level, and the feed current I is dropped to the reference level.

After timing t2, the first gate voltage Gt falls to reach low level.

After that, when at timing t3 the output voltage Out turns from low level to high level, the first gate voltage Gt starts to rise slowly, and the second gate voltage Mcg is latched at low level by the latch circuit 242 as mentioned previously. Thus, the NMOS switch 243 is turned off. Since the output voltage Out is at high level, the OR output A is at high level, and the feed current I is at the reference level.

After that, when at timing t4 the first gate voltage Gt rises to reach the reference voltage Vref, the comparison signal Cmp turns to low level. After timing t4, the first gate voltage Gt rises to reach high level.

As described above, the feed current I is increased only during a limited period in which the output voltage Out and the second gate voltage Mcg are both at low level (the period from timing t1 to t2). It is thus possible to reduce power consumption while improving the operating speed of the comparator 241 only when necessary.

Figure 4:
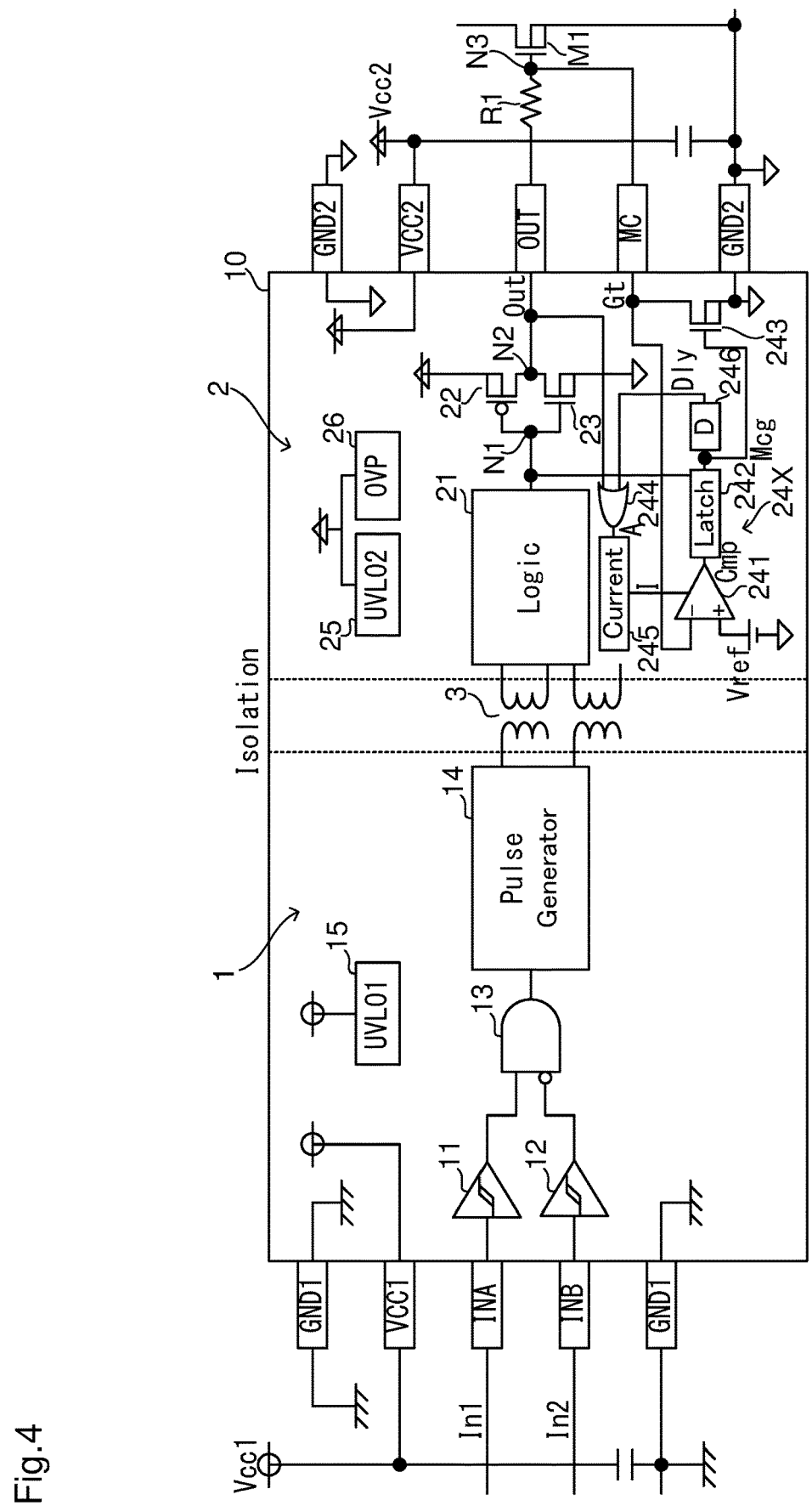
FIG. 4 is a diagram showing a configuration of a gate driver according to a modified example.

<Modified example> FIG. 4 is a diagram showing the configuration of a gate driver 10 including a mirror clamp circuit 24X according to a modified example of the embodiment described previously.

A difference of the configuration of the mirror clamp circuit 24X shown in FIG. 4 from that in the previously-described embodiment (FIG. 1) is that the mirror clamp circuit 24X includes a delay circuit 246.

More specifically, the delay circuit 246 is disposed in a stage succeeding the latch part 242, and delays the second gate voltage Mcg, which is output from the latch circuit 242, to output a delayed signal Dly to the first input terminal of the OR circuit 244.

Figure 5:
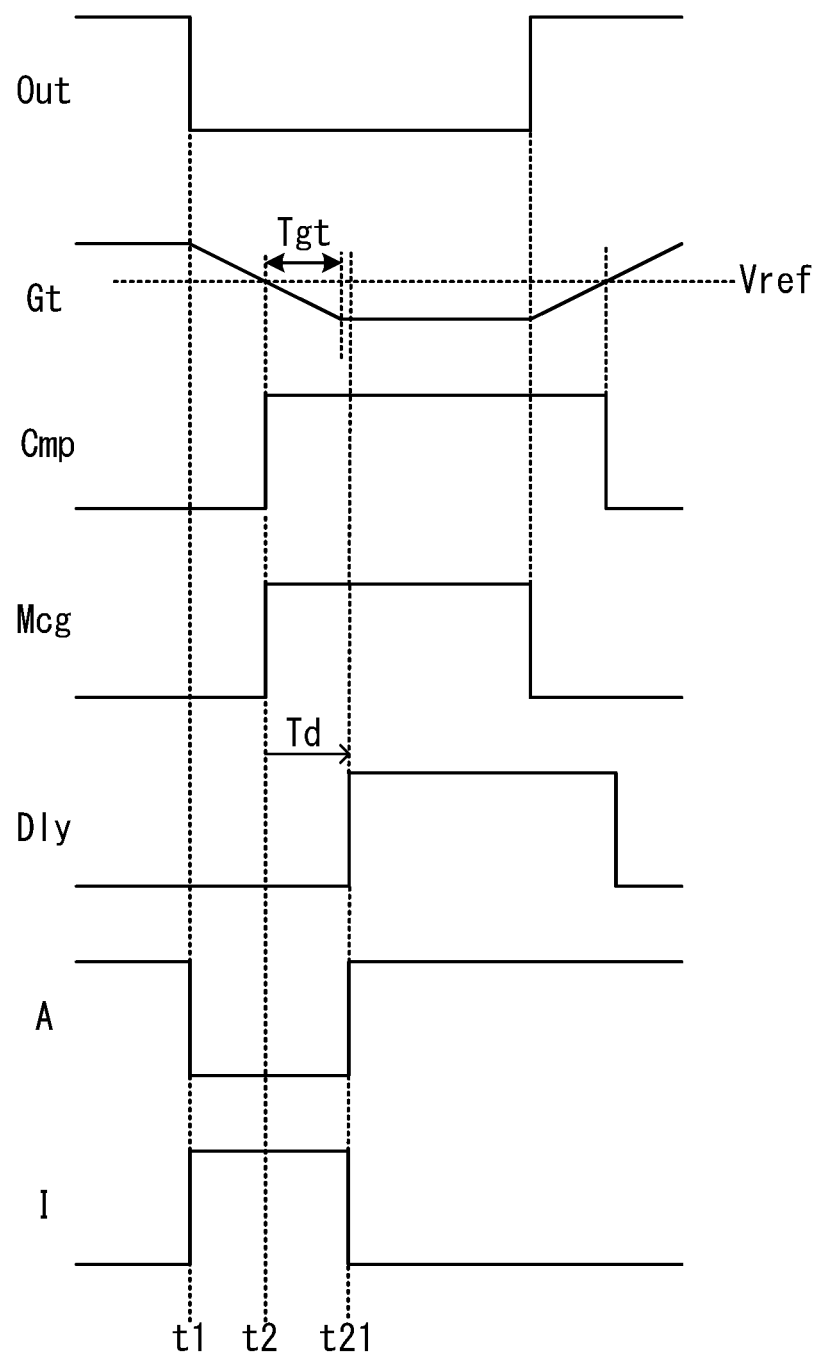
FIG. 5 is a timing chart showing an example of operation of a mirror clamp circuit according to the modified example.

FIG. 5 is a timing chart showing the operation of the mirror clamp circuit 24X according to the so modified example.

At timing t1 shown in FIG. 5, when the output voltage Out turns from high level to low level, the OR output A of the OR circuit 244 turns from high level to low level and the feed current I is increased above the reference level. After that, when the output voltage Out falls to reach the reference voltage Vref at timing t2, the comparison signal Cmp turns to high level and the second gate voltage Meg turns to high level. Thus, the NMOS switch 243 is turned on.

After that, at timing t21, which is delayed from timing t2 by a delay time Td, the delayed signal Dly turns to high level. Thus, the OR output A turns to high level and the feed current I falls to the reference level.

Here, shown in FIG. 5, the delay time Td is set longer than the time Tgt that the first gate voltage Gt requires to fall from the reference voltage Vref to low level. In this way, until the first gate voltage Gt completely turns to low level, the feed current I can be kept stable so as not to vary.

<Modifications> It should be understood that the above-described embodiment is in every aspect illustrative and not restrictive. The scope of the present invention is defined not by the description of the embodiment given above but by the appended claims, and encompasses any modifications made without departure from the scope and sense equivalent to those claims.

INDUSTRIAL APPLICABILITY

The present invention finds applications in, for example, gate drivers.

REFERENCE SIGNS LIST 10 gate driver
1 primary circuit
11 first Schmitt trigger
12 second Schmitt trigger
13 AND circuit
14 pulse generator
15 first UVLO circuit
2 secondary circuit
21 logic circuit
22 PMOS transistor
23 NMOS transistor
24 mirror clamp circuit
241 comparator
242 latch circuit
243 NMOS switch
244 OR circuit
245 current feeder
246 delay circuit
25 second UVLO circuit
26 OVP circuit
R1 resistor
M1 NMOS transistor

The invention claimed is:

1. A mirror clamp circuit comprising:
   a comparator having:
      a first input terminal connectable to a first control terminal of a transistor having
         the first control terminal connected to another terminal of a resistor of which one terminal is fed with an output voltage and
         a first terminal fed with a reference potential; and
      a second input terminal fed with a reference voltage;
   a transistor switch having a second control terminal fed with a control terminal voltage based on a comparison signal output from the comparator, the transistor switch being inserted between the first control terminal and the reference potential;
   an OR circuit fed with a signal based on the control terminal voltage and the output voltage; and
   a current feeder configured to change an amount of current fed to the comparator based on an output of the OR circuit.

2. The mirror clamp circuit according to claim 1, further comprising:
   a latch circuit configured to latch the control terminal voltage at low level when the output voltage is at high level.

3. The mirror clamp circuit according to claim 1, further comprising:
   a delay circuit configured to delay the control terminal voltage and output, as a result of the delaying, a delayed signal,
   wherein
   the signal based on the control terminal voltage is the delayed signal.

4. The mirror clamp circuit according to claim 1, wherein the current feeder includes:
   a first constant-current source;
   a first current mirror configured to generate a first output current based on a first input current generated by the first constant-current source;
   a second current mirror configured to generate a second output current based on the first input current;
   a switch disposed in a path across which the second output current flows, the switch being configured to be turned on and off based on the output of the OR circuit; and
   wherein
   when the switch is on, a current is supplied to the comparator based on a current generated by combining the first and second output currents together.

5. The mirror clamp circuit according to claim 4, wherein the first current mirror, the second current mirror, and the switch are configured with PMOS transistors.

6. The mirror clamp circuit according to claim 1, wherein the transistor switch is an NMOS transistor.

7. An IC package comprising:
   the mirror clamp circuit according to claim 1;
   an output terminal configured to output the output voltage to outside;
   a mirror clamp terminal configured to permit the first control terminal to be connected to outside; and
   a reference potential terminal configured to permit the reference potential to be applied thereto.

8. The IC package according to claim 7, further comprising:
   a pulse generator configured to generate a pulse based on an input signal;
   a logic circuit;
   an isolation transformer configured to transmit the pulse to the logic circuit; and
   a switching arm configured with a switching element connected in series between a supply voltage and the reference potential, the switching arm being configured to generate the output voltage by being driven by the logic circuit.

* * * * *